United States Patent
Gambino et al.

(10) Patent No.: US 6,797,610 B1
(45) Date of Patent: Sep. 28, 2004

(54) SUBLITHOGRAPHIC PATTERNING USING MICROTRENCHING

(75) Inventors: Jeffrey P. Gambino, Westford, VT (US); Peter J. Lindgren, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,019

(22) Filed: Dec. 11, 2002

(51) Int. Cl.[7] .................................. H01L 21/4763
(52) U.S. Cl. ...................... 438/637; 438/745
(58) Field of Search ................... 438/593, 637, 438/723, 724, 745, 747, 750

(56) References Cited

U.S. PATENT DOCUMENTS

| | | | |
|---|---|---|---|
| 5,447,878 A | | 9/1995 | Park et al. |
| 5,464,791 A | | 11/1995 | Hirota |
| 5,567,637 A | * | 10/1996 | Hirota |
| 5,736,418 A | | 4/1998 | Pasch et al. |
| 5,804,088 A | | 9/1998 | McKee |
| 5,895,273 A | | 4/1999 | Burns et al. |
| 5,935,874 A | | 8/1999 | Kennard |
| 5,989,971 A | | 11/1999 | Tu et al. |
| 6,121,154 A | | 9/2000 | Haselden et al. |
| 6,132,631 A | | 10/2000 | Nallan et al. |
| 6,221,785 B1 | * | 4/2001 | Tien |
| 6,235,214 B1 | * | 5/2001 | Deshmukh et al. |
| 6,297,168 B1 | | 10/2001 | Shieh et al. |

* cited by examiner

Primary Examiner—Phuc T. Dang
(74) Attorney, Agent, or Firm—William D. Sabo

(57) ABSTRACT

A sublitohgraphic trench is formed in a semiconductor substrate by first forming a microtrench which is subsequently used as a mask. Filled sublithographic trenches are formed with a width corresponding to the width of the microtrenches.

12 Claims, 5 Drawing Sheets

SUBLITHOGRAPHIC PATTERNING USING MICROTRENCHING

BACKGROUND OF INVENTION

1. Technical Field

The present invention relates generally to semiconductor manufacture, and more particularly, to the formation of a sublithographic trench in a semiconductor substrate.

2. Related Art

A number of processes have been proposed for patterning, featuring dimensions that are smaller than those obtainable by conventional photolithography. For example, sidewall image transfer is available for patterning layers by subtractive etching. However, this process is not suitable for producing sublithographic trenches. Because trench patterns are widely used in a number of applications, such as making damascene gates, damascene interconnects, isolation trenches, etc., it would be desirable to have a process that could be employed to achieve trenches with sublithographic dimensions.

Typically, when trenches having sublithographic dimensions have been formed, it has occurred as an undesirable artifact of an etching process. For example, during polysilicon gate etch with a high density plasma reactor, ions reflecting off sidewalls can cause increased etching at the periphery of the feature and possibly trenching into the underlying substrate. Such microtrenching into the substrate can adversely affect device performance and reliability. See, for example, U.S. Pat. No. 5,895,273, for a discussion of microtrenching problems. In this context, microtrenching has been studied, with the objective being to avoid or overcome it as undesirable. See also, J. -H. Lee, et al. Effects Of Buffer Layer Structure On Polysilicon Buffer LOCOS For The Isolation Of Submicron Silicon Devices, IEEE Transactions On Electron Devices, Vol. 45, No. 10, October 1998, pp. 2153–2160; I. J. Gupta, et al., A Comprehensive Assessment of Microtrenching During High Density Polysilicon Etch, 3rd International Symposium on Plasma Process-Induced Damage, June 1998, pp. 84–87, and Morioka, et al., Effect of Wafer Bias Frequency On Microtrenching During High Selective Gate Etching, 4th International Symposium On Plasma-Process Induced Damage, May 1999, pp. 159–162.

On the contrary, approaches attempting to use microtrenching, rather than avoiding it, are described in U.S. Pat. No. 5,736,418 and Eur. Pat. Appln., Pub. No. EP 0 632 495 A2. In the first reference, Microtrenches are formed in an effort to control hot electron effects and in the second, microtrenches are formed, then filled, to form isolation structures. Neither, however, uses the microtrenches for further etching definition and control.

Therefore, there exists a need in the industry for an improved method of making a sublithographic trench, without adding an unreasonable number of steps, while at the same time addressing other manufacturing problems such as microtrenching.

SUMMARY OF INVENTION

It is against this background that the present invention introduces a method of forming a sublithographic trench by first forming a microtrench, which is subsequently used as a mask. In particular, in accordance with the invention, there is provided a method of forming a sublithographic trench in a semiconductor substrate, comprising the steps of: forming a selectively etchable layer on the substrate; forming a masking layer on the selectively etchable layer; forming a pattern in the masking layer; using the pattern to partially etch the selectively etchable layer to form a microtrench therein; and using the microtrench as a mask to etch a sublithographic trench in the substrate.

Further, in accordance with the invention, there is provided a trench formed in a semiconductor substrate, the trench having a width which is sublithographic and corresponds to the width of a micotrench etched into a selectively etchable layer over the substrate.

The foregoing and other features and advantages of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1A:
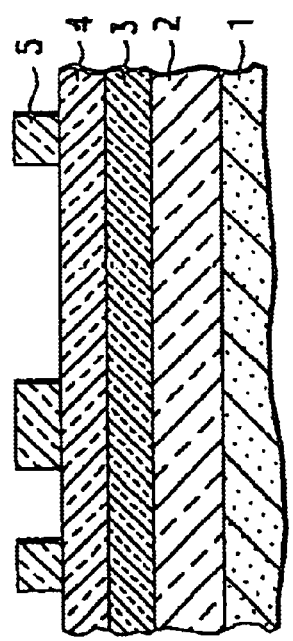
FIGS. 1A–1F are schematic section views illustrating the method steps of one embodiment according to the present invention.

Referring to the drawings, FIGS. 1A–1F show an example of a method sequence, which provides a sublithographic trench in inorganic and organic insulator layers, which is subsequently filled with a conductive material. As shown in FIG. 1A, there is shown a processed semiconductor structure 1, which may typically include a semiconductor substrate comprising silicon, GaAs or the like, on which devices such as capacitors and transistors are formed. Deposited on the structure 1 is an insulator 2, which in this example is a low-k organic material, generally having a dielectric constant less than 4. An example of a suitable low-k organic material is disclosed in U.S. Pat. No. 5,965,679, the entire contents of which are incorporated herein by reference, as well as details concerning its preparation and use. Other low-k organic materials that can be employed will be known to those skilled in the art. An additional insulator 3, such as an inorganic material, e.g. silicon carbide, is deposited on the insulator 2. Typically, layers 2 and 3 are applied by spin coating, although dip coating, spray coating, extrusion coating, etc. may be suitably employed. Typically, the organic insulator 2 is about 100–1,000, or preferably 400–600 (e.g. 500) nanometers (nm) thick, while the inorganic insulator 3 is about 20–200, or preferably 40–60 (e.g. 50), nm thick.

A two-layer hard mask is then provided on the inorganic insulator 3, which includes a silicon nitride layer 4 and a silicon oxide layer 5. These layers 4 and 5 can be deposited, for example, by chemical vapor deposition (CVD) so that the layers 4 and 5 are about 10–100, preferably 40–60 (e.g.

50), nm thick and 50–200, preferably 75–125 (e.g. 100), nm thick, respectively. Conventional photolithography was employed to form a photoresist pattern that was transferred into silicon oxide layer 5 by reactive ion etching (RIE).

Figure 1B:
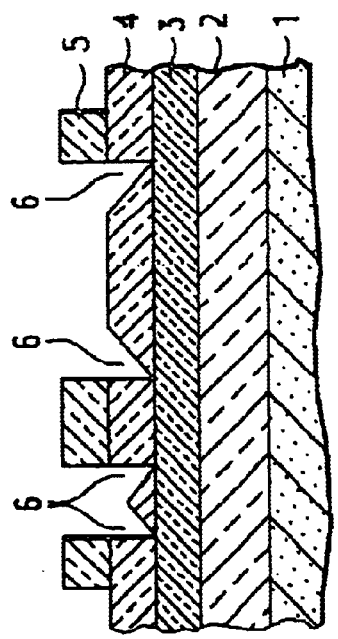
Figure 1C:
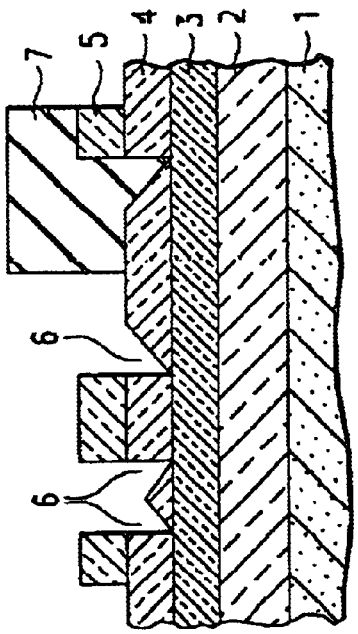
Figure 1D:
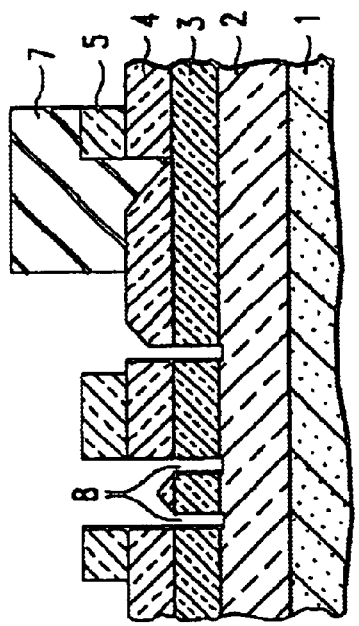
Figure 1E:
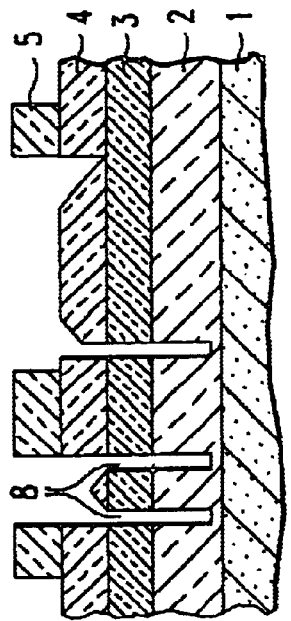

As shown in FIG. 1B, an RIE process, such as one that is fluorine-based (e.g. $CF_4$, $CHF_3$, or $C_4F_8$) with high bias voltage, is used to partially etch the silicon nitride layer 4. During etching, an enhanced reaction occurs as a result of ion scattering from the sidewalls to form microtrenches 6. If desired, a blocking mask (e.g. a photoresist) 7 is applied as to cover some of the microtrenches but not all to define a pattern where sublithographic trenches are to be formed, as shown in FIG. 1C. Sublithographic trenches then will be formed only at the edges of the silicon oxide hardmask 5 which are not covered by the blocking mask 7. Additional etching of the silicon nitride layer 4 defines the widths of the sublithographic trenches 8 t be formed, as shown in FIG. 1D. Next, sublithographic trenches 8 are etched into the underlying layers 3 and 2 or substrate, using the microtrenches as a mask pattern, using conventional RIE processing as will be apparent to those skilled in the art. For example, an oxygen/nitrogen-based process can be used, such as $N_2/H_2$. It should be noted, that during the etching, the blocking mask 7 is removed, as shown in FIG. 1E.

Figure 1F:
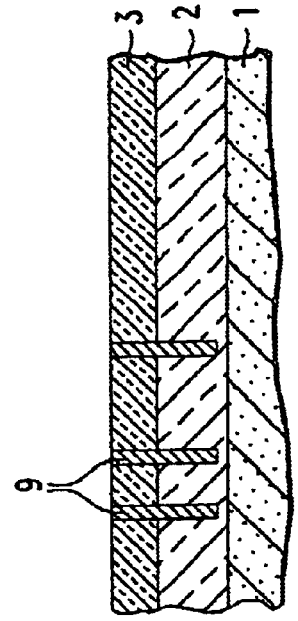

Following formation of the sublithographic trenchs 8, further processing would include depositing a conductor 9 over the insulator 3 and into the sublithographic trenches 8. The conductor 9 may comprise copper in a particularly preferred embodiment, which would usually be deposited by electroplating, although other techniques, such as electroless plating, could be employed. Once the sublithographic trenches 8 have been filled with conductor 9, the surface of conductor 9 with insulator 3 is coplanarized using chemical mechanical polishing or other suitable technique, as shown in FIG. 1F. During coplanarization, the silicon oxide and silicon nitride hardmasks, 5 and 4, respectively, would be removed to provide a filled sublithographic trench 8 in the inorganic insulator 3 and organic insulator 2.

Figure 2A:
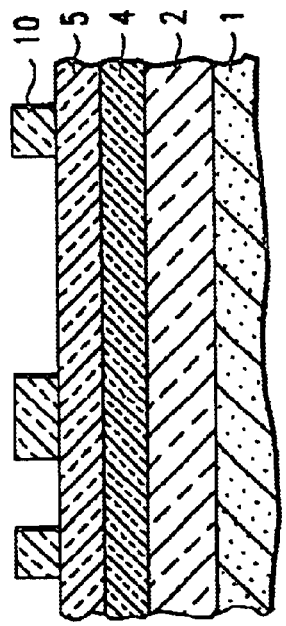
FIGS. 2A–2F are schematic section views illustrating the method steps of another embodiment according to the present invention.
Figure 2B:
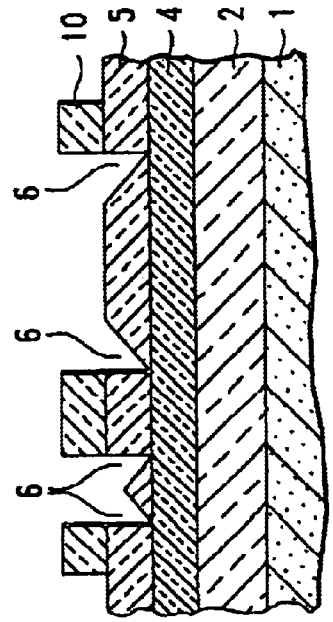
Figure 2C:
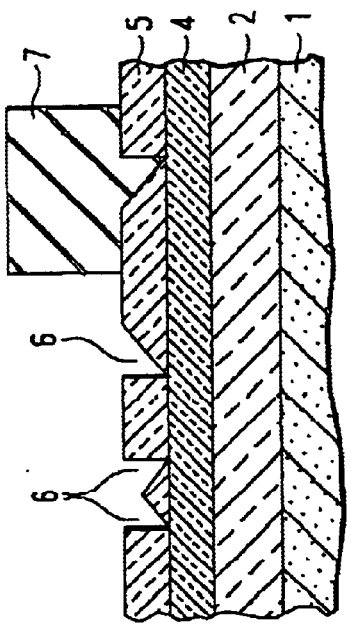

FIGS. 2A–2F show another example of a method sequence, which is similar to that of FIGS. 1A–1F, but does not involve use of an insulator 3. This sequence also provides a sublithographic trench in inorganic and organic insulator layers which is subsequently filled with a conductive material. As shown in FIG. 2A, a two-layer hard mask is provided on an insulator 2, which comprises a low-k organic material, where the hardmask includes a silicon nitride layer 4, deposited on the insulator 2, and a silicon oxide layer 3. Conventional photolithography was employed to form a photoresist pattern 10 that was transferred into silicon oxide layer 5 by RIE, e.g. using fluorine-based (such as $CF_4$, $CHF_3$ or $C_4F_8$) with high bias voltage to partially etch the silicon oxide layer 5, as shown in FIG. 2B. The etch conditions are selected so that silicon oxide is removed to form microtrenches 6, while leaving behind silicon oxide at the centers of the etch patterns. As shown in FIG. 2C, if desired, a blocking mask (e.g. photoresist) 7 is applied as to cover some of the microtrenches but not all, to define a pattern where sublithographic trenches are to be formed.

Figure 2D:
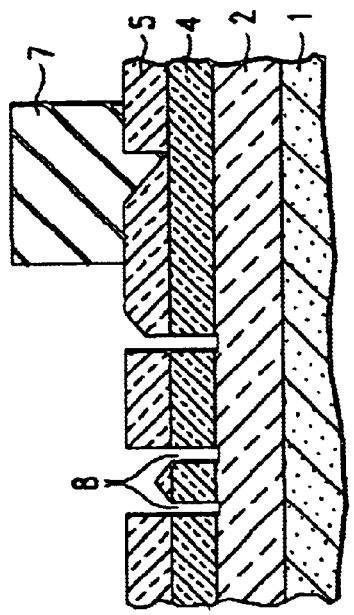
Figure 2E:
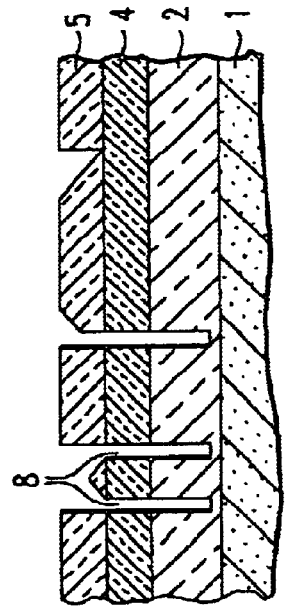
Figure 2F:
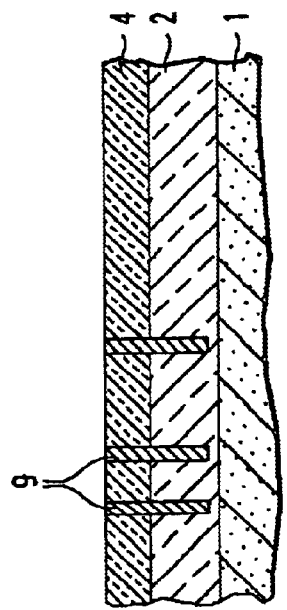

Referring to FIG. 2D, RIE is used to etch silicon nitride layer 4 with high selectivity to silicon oxide layer 5, e.g. using a fluorine-based RIE process. Sublithographic trenches 8 are formed in the silicon nitride layer 4, using the microtrenches as a mask pattern, in regions not covered by the blocking mask 7. The depths of the sublithographic trenches 8 are extended by further etching into the insulator 2 using, for example, an oxygen/nitrogen-based process, such as $N_2/H_2$. It should again be noted that during the etching, the blocking mask 7 is removed, as shown in FIG. 2E.

Following formation of the sublithographic trenches 8, further processing can be carried out as, for example, in accordance with the first example. In that case, the result is a metal 9 filled, sublithographic trench 8 in the hard mask silicon nitride layer 4 an organic insulator 2, with the silicon nitride layer 4 having served as a polish stop.

Figure 3A:
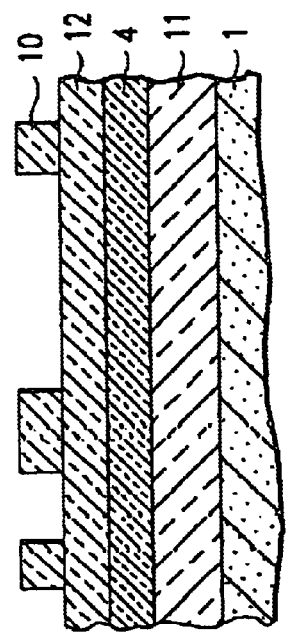
FIGS. 3A–3F are schematic section views illustrating the method steps of yet another embodiment according to the present invention.
Figure 3B:
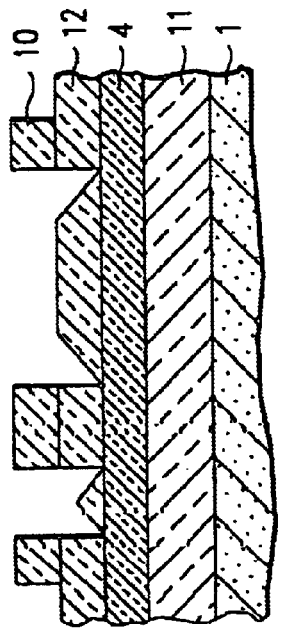
Figure 3C:
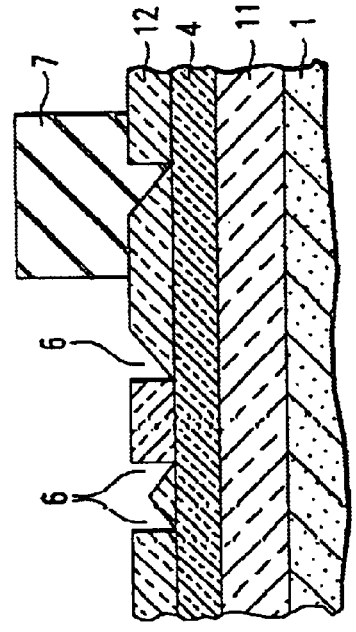

FIGS. 3A–3F show another example of a method sequence, which is similar to that of the second example of FIGS. 2A–2F, but using a different material, an antireflective coating (ARC) instead of silicon oxide, and an inorganic insulator in place of the organic insulator. This sequence provides a sublithographic trench in inorganic insulator layers which is subsequently filled with a conductive material. As shown in FIG. 3A, deposited on the structure 1 is an insulator 11, which in this example is an inorganic material, such as silicon oxide. A silicon nitride layer 4 is deposited on the insulator 11, and an ARC 12 (e.g. "Duv30" available from Japan Synthetic Rubber Company) is deposited on the silicon nitride layer using, for example, standard spin apply and baking conditions. Conventional photolithography was employed to form a photoresist pattern 10 that was transferred into ARC layer 12 by RIE, e.g. using oxygen-based RIE with high bias voltage to partially etch the ARC layer 12, as shown in FIG. 3B. The etch conditions are selected so that ARC is removed to form microtrenches 6, while leaving behind ARC at the centers of the etch patterns. As shown in FIG. 3C, if desired, a blocking mask (e.g. photoresist) 7 is applied as to cover some of the microtrenches but not all, to define a pattern where sublithographic trenches are to be formed.

Figure 3D:
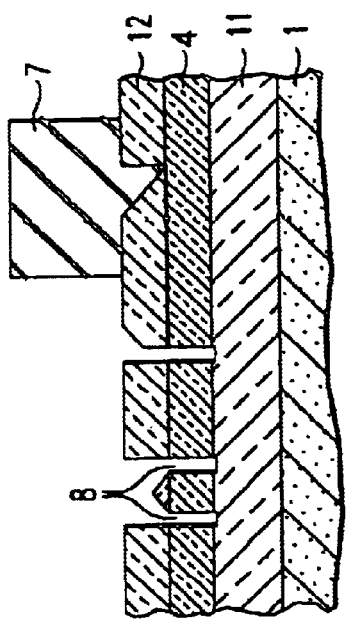
Figure 3E:
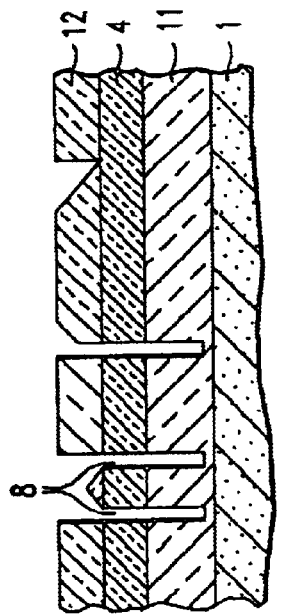
Figure 3F:
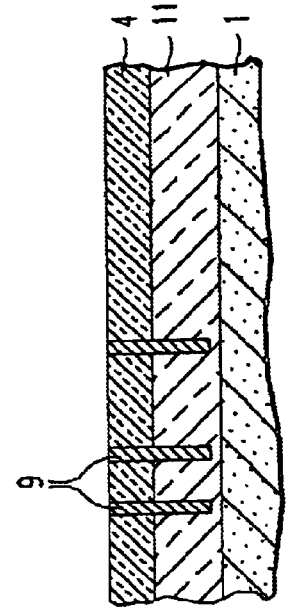

Referring to FIG. 3D, RIE is used to etch silicon nitride layer 4 with high selectivity to silicon oxide layer 11, e.g. using a fluorine-based RIE process. Sublithographic trenches 8 are formed in the silicon nitride layer 4, using the microtrenches as a mask pattern, in regions not covered by the blocking mask 7. The depths of the sublithographic trenches 8 are extended by further etching into the insulator 11 using, for example, a fluorine-based RIE process that is selective to silicon nitride 4, such as C4F8/CH3/Ar. It should again be noted that during the etching, the blocking mask 7 is removed, as shown in FIG. 3E.

Following formation of the sublithographic trenches 8, further processing can be carried out as, for example, in accordance with the second example. In that case, the result is a metal 9 filled, sublithographic trench 8 in the hard mask silicon nitride layer 4 and inorganic insulator 11, with the silicon nitride layer 4 having served as a polish stop.

Figure 4A:
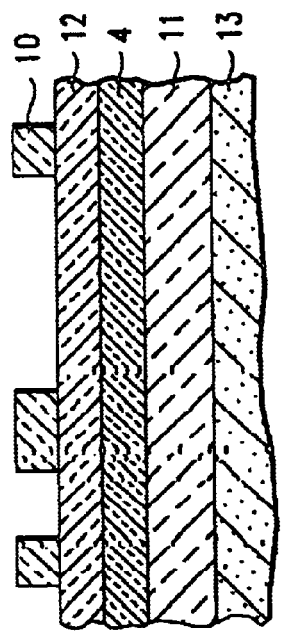
FIGS. 4A–4F are schematic section views illustrating the method steps of a further embodiment according to the present invention.
Figure 4B:
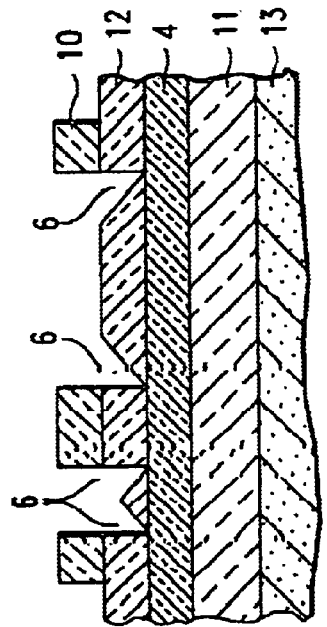
Figure 4C:
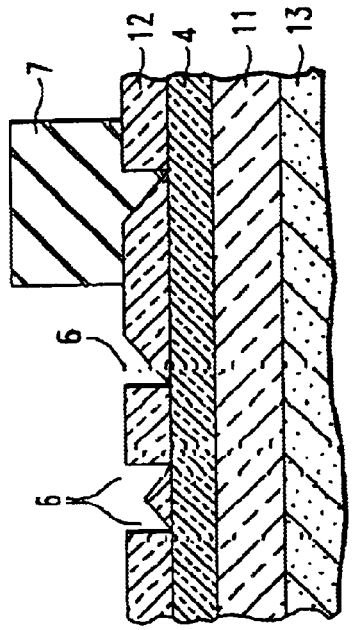

FIGS. 4A–4F show another example of a method sequence, which is similar to that of the third example of FIGS. 3A–3F, but in particular the inorganic insulator 11 is applied over a substrate 13 comprising silicon. This sequence also provides a sublithographic trench in inorganic insulator layers which is subsequently filled with a conductive material. As shown in FIG. 4A, an inorganic material such as silicon oxide is deposited, as to provide an insulator 11 on substrate 13. As in the third example, a silicon nitride layer 4 is deposited on the insulator 11, and an ARC 12 (e.g. "DUV30") is deposited on the silicon nitride layer using, for example, standard spin apply and baking conditions. Convention photolithography was employed to form a photoresist pattern 10 that was transferred into ARC layer 12 by RIE, e.g. using oxygen-based RIE with high bias voltage to partially etch the ARC layer 12, as shown in FIG. 4B. The etch conditions are selected so that ARC is removed to form microtrenches 6, while leaving behind ARC at the centers of the etch patterns. As shown in FIG. 4C, if desired, a blocking mask (e.g. photoresist) 7 is applied as to cover some of the microtrenches but not all, to define a pattern where sublithographic trenches are to be formed.

Figure 4D:
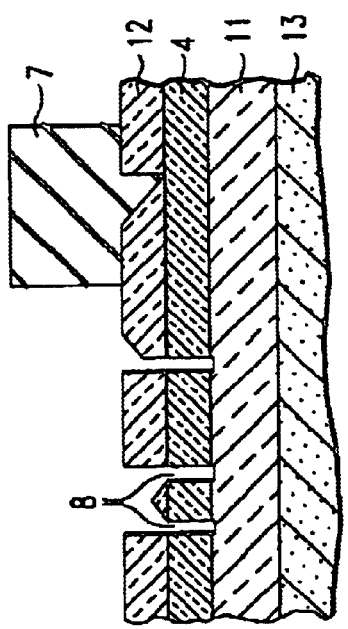
Figure 4E:
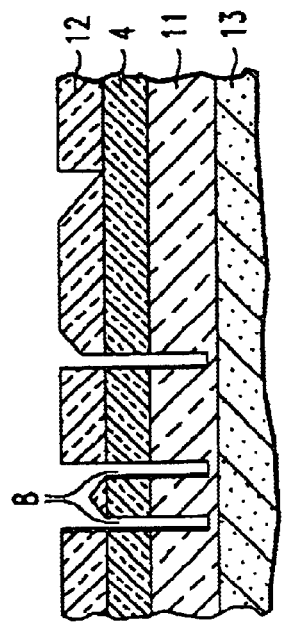
Figure 4F:
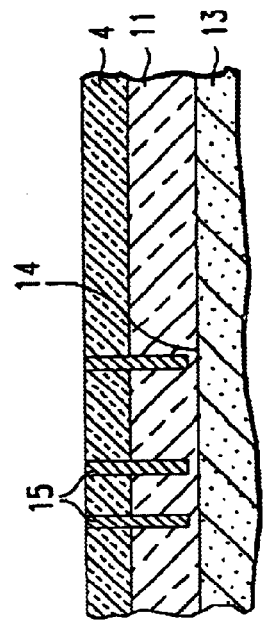

Referring to FIG. 4D, RIE is used to etch silicon nitride layer 4 with high selectivity to silicon oxide layer 11, e.g. using a fluorine-based RIE process. Sublithographic trenches 8 are formed in the silicon nitride layer 4, using the microtrenches as a mask pattern, in regions not covered by the blocking mask 7. The depths of the sublithographic trenches 8 are extended by further etching into the insulator 11 using, for example, a fluorine-based RIE process that is selective to silicon nitride 4, such as $C_4F_8/CH_3/Ar$. It should again be noted, that during the etching, the blocking mask 7 is removed, as shown in FIG. 4E, and that the etching extends down to the substrate 13, or to an etch stop layer, such as silicon nitride, applied to the substrate 13.

Following formation of the sublithographic trenches 8, further processing can be carried out to grow a gate dielectric (e.g. silicon oxide, silicon nitride, silicon oxynitride, etc.) on the substrate 13, then depositing a conductor 15 over the insulator 4 and into the sublithographic trenches 8. The conductor 15 may include, for example, doped polysilicon, refractory metal such as tungsten, titanium nitride, etc. As in the third example, the surface is coplanarized to provide a filled sublithographic trench 8 in the silicon nitride layer 4 and inorganic insulator 11, with the silicon nitride layer 4 having served as a polish stop.

Figure 5A:
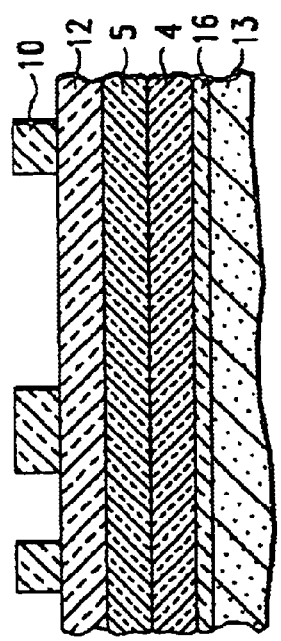
FIGS. 5A–5F are schematic section views illustrating the method steps of a still further embodiment according to the present invention.
Figure 5B:
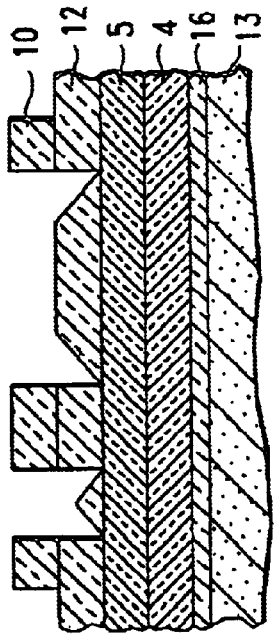
Figure 5C:
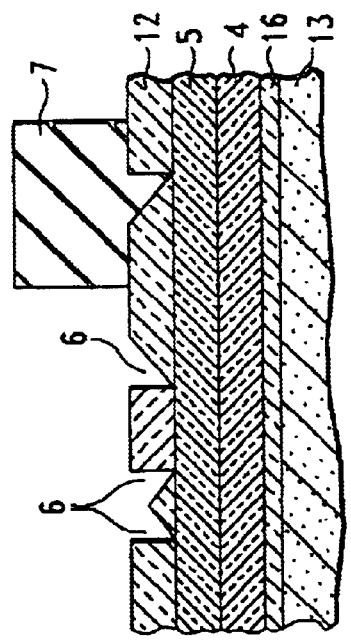

FIGS. 5A–5F show another example of a method sequence, which is similar to that of the third example of FIGS. 3A–3F, but provides a trench in the substrate which is subsequently filled with an insulative material. As shown in FIG. 5A, a pad oxide 16 is grown over substrate 13, to a thickness usually about 10–100, preferably 40–60 (e.g. 50) nm, then a silicon nitride layer 4, with a thickness usually about 50–500, preferably 150–250 (e.g. 200) nm, and a silicon oxide layer 5, with a thickness usually about 10–100, preferably 40–60 (e.g. 50) nm, are deposited, such as by CVD. Next, an ARC 12 (e.g. "DUV30") is deposited on the silicon oxide layer 5 using, for example, standard spin apply and baking conditions. Conventional photolithography was employed to form a photoresist pattern 10 that was transferred into ARC layer 12 by RIE, e.g. using oxygen-based RIE with high bias voltage to partially etch the ARC layer 12, as shown in FIG. 5B. The etch conditions are selected so that ARC is removed to form microtrenches 6, while leaving behind ARC at the centers of the etch patterns. As shown in FIG. 5C, if desired, a blocking mask (e.g. photoresist) 7 is applied as to cover some of the microtrenches but not all, to define a pattern where sublithographic trenches are to be formed.

Figure 5D:
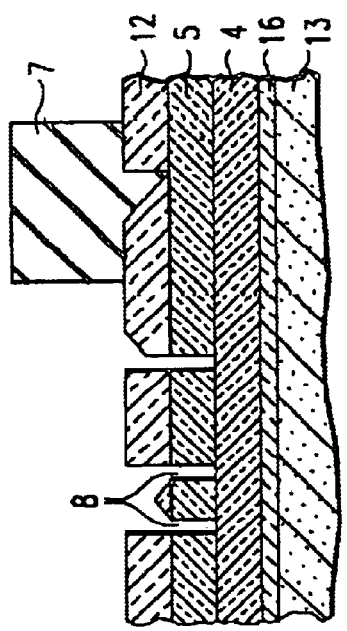
Figure 5E:
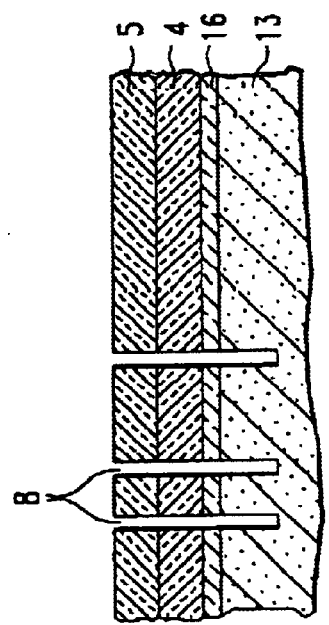
Figure 5F:
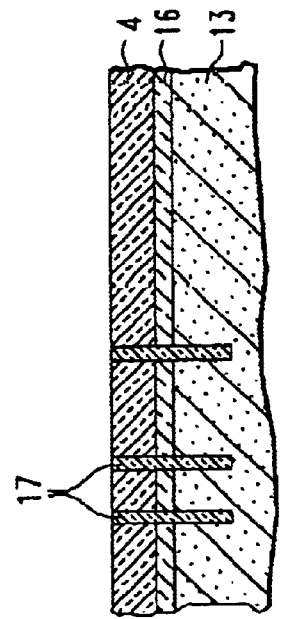

Referring to FIG. 5D, RIE is used to etch silicon oxide layer 5 with high selectivity to silicon nitride layer 4, e.g. using a fluorine-based RIE process. Sublithographic trenches 8 are formed in the silicon oxide layer 5, using the microtrenches as a mask pattern, in regions not covered by the blocking mask 7. The depths of the sublithographic trenches 8 are extended by further etching into the silicon nitride layer 4 using, for example, a fluorine-based RIE process that is selective to silicon oxide 16, and into the pad oxide 16 by further etching with, for example, $CF_4$, $CHF_3$ or $C_4F_8$. Etching is then continued into the substrate 13 using, for instance, a chlorine-based RIE process that is selective to silicon oxide.

Following formation of the sublithographic trenches 8, further processing can be carried out as, for example, in accordance with the third example, except that an insulative material 17, such as silicon oxide is deposited over the silicon nitride layer 4 into the sublithographic trenches 8. During coplanarization, the silicon nitride layer 4 would serve as a polish stop.

In a variation of the previous example, no blocking mask is used, so that oxide filled, sublithographic trenches are formed only around the perimeter of the isolation regions. As will be apparent, this would reduce the oxide pattern factor in large isolation areas, i.e. self-aligned shallow trench isolation (STI) fill.

While this invention has been described in conjunction with the specific embodiments outlined above, it is evident that many alternatives, modifications and variations will be apparent to those skilled in the art. For example, a wide variety of materials may be used for the various layers over a wide range of thicknesses, and etching conditions may be extensively modified, depending upon the structures being formed, and so forth. Accordingly, the embodiments of the invention as set forth above are intended to be illustrative, not limiting. Various changes may be made without departing from the spirit and scope of the invention as defined in the following claims.

What is claimed is:

1. A method of forming a sublithographic trench in a semiconductor substrate, comprising the steps of:

forming a selectively etchable layer on said substrate;

forming a masking layer on said selectively etchable layer;

forming a pattern in said masking layer;

using said pattern to partially etch said selectively etchable layer to form a microtrench therein; and using said microtrench as a mask to etch a sublithographic trench in said substrate, wherein a plurality of microtrenches are formed in said selectively etchable layer; and a blocking mask is formed over one or more but less than all of said plurality of microtrenches.

2. The method of claim 1, wherein said blocking mask comprises a photoresist.

3. The method of claim 1, wherein said masking layer comprises a hardmask.

4. The method of claim 3, wherein said hardmask comprises silicon oxide, silicon nitride or a combination thereof.

5. The method of claim 3, wherein said masking layer comprises a photoresist.

6. The method of claim 1, wherein said substrate comprises an organic material, silicon oxide, silicon carbide, silicon nitride or silicon.

7. The method of claim 1, wherein said selectively etchable layer comprises silicon nitride, silicon oxide or an antireflective coating.

8. A method of forming a sublithographic trench in a semiconductor substrate, comprising the steps of:

forming a selectively etchable layer on said substrate;

forming a masking layer on said selectively etchable layer;

forming a pattern in said masking layer;

using said pattern to partially etch said selectively etchable layer to form a microtrench therein; and using said microtrench as a mask to etch a sublithographic trench in said substrate, wherein said substrate comprises an organic material; said masking layer comprises a hardmask, and said selectively etchable layer comprises silicon nitride.

9. The method of claim 8 wherein a plurality of microtrenches are formed in said selectively etchable layer; and a blocking mask is formed over one or more but less than all of said plurality of microtrenches; and further wherein said hardmask is silicon oxide.

10. The method of claim 1, wherein said method further comprises depositing a conductor or insulative material into said sublithograhic trench.

11. The method of claim 10, wherein said conductor comprises copper, tungsten or polysilicon and said insulative material comprises silicon oxide.

12. The method of claim 10, wherein said method further comprises coplanarizing said conductor or insulative material with said substrate.

* * * * *